United States Patent [19]

Nuzzi

[11] 3,962,494
[45] June 8, 1976

[54] SENSITIZED SUBSTRATES FOR CHEMICAL METALLIZATION

[75] Inventor: Francis J. Nuzzi, Lynbrook, N.Y.

[73] Assignee: Photocircuits Division of Kollmorgan Corporation, Glen Cove, N.Y.

[22] Filed: May 8, 1974

[21] Appl. No.: 468,077

Related U.S. Application Data

[63] Continuation of Ser. No. 167,506, July 29, 1971, abandoned.

[52] U.S. Cl. .................................. 427/304; 106/1; 427/305; 427/306
[51] Int. Cl.² ............................................. C23C 3/02
[58] Field of Search .......... 117/47 A, 130 E, 160 R; 106/1; 427/304, 305, 306

[56] References Cited
UNITED STATES PATENTS

| 3,011,920 | 12/1961 | Shipley | 117/213 |
|---|---|---|---|
| 3,075,856 | 1/1963 | Lukes | 117/47 A |
| 3,119,709 | 1/1964 | Adkinson | 117/47 A |
| 3,147,154 | 9/1964 | Cole et al. | 117/130 E |
| 3,442,683 | 5/1969 | Lenoble | 117/47 A |
| 3,467,540 | 9/1969 | Schick | 117/47 A |
| 3,523,824 | 8/1970 | Powers et al. | 117/239 |
| 3,524,754 | 8/1970 | Blytas et al. | 117/47 A |
| 3,561,995 | 2/1971 | Wu et al. | 117/47 A |
| 3,664,860 | 5/1972 | Kamiya | 117/160 R |
| 3,672,939 | 6/1972 | Miller | 117/47 A X |

OTHER PUBLICATIONS

Brenner, "Electroless Plating Comes of Age" Metal Finishing, Dec., 1954.

Primary Examiner—Ralph S. Kendall
Assistant Examiner—John D. Smith
Attorney, Agent, or Firm—Morgan, Finnegan, Pine, Foley & Lee

[57] ABSTRACT

A process for the production of metallized bodies, such as printed circuits, dials, nameplates, metallized plastics, glass, ceramics and the like, comprising treating a base with a composition comprising a metal salt reducible to catalytically active metal nuclei and a secondary reducing agent, and thereafter exposing the base to a primary chemical reducing agent to produce a layer of metal nuclei on the surface of the base. Exposing the sensitized base to an electroless metal deposition solution causes electroless metal to deposit on the nuclei.

37 Claims, No Drawings

SENSITIZED SUBSTRATES FOR CHEMICAL METALLIZATION

This is a continuation of application Ser. No. 167,506, filed July 29, 1971, now abandoned.

This invention relates to novel and improved methods for metallizing bodies, e.g., insulating supports, and to the products which result from such methods.

More particularly, the present invention relates to imposing, by chemical reduction methods, sensitive non-conductive metallic areas on the surfaces of such bodies which catalyze the deposition of strongly adherent deposits of electroless metal.

Although applicable whenever it is desired to apply a metallic coating to a base, as for example, for decorative or protective effects, or to make electrical conductors of a wide variety of shapes and configurations, the procedures for metallization herein are particularly useful for making printed circuits from readily available base materials, e.g., metal clad laminates, resinous insulating laminated bases or porous non-conductive materials, e.g., fiberglass, paper, cardboard, ceramics and the like.

It is a primary object of this invention to provide bases sensitive to metallization by electroless plating and, optionally, subsequent electroplated metal deposition.

Another principal object of this invention is to provide improvements in metallization processes in which a base is sensitized to metallization by electroless plating.

An additional object of this invention is to provide base materials and processes for electroless metallization in which there can be employed non-noble metal sensitizers which are much more economical in cost, but equivalent in performance to the noble metal-containing sensitizers used until now.

Although the invention will be described with particular reference to printed circuits, it should be understood that the invention is not limited to printed circuits but is applicable to metallized surfaces broadly.

Heretofore, it has been known to employ a number of pretreatment or sensitization baths in effecting the electroless deposition of metals on various surfaces. All such prior art sensitization baths used commercially have been expensive because they depend upon a noble metal, e.g., palladium, platinum, gold, silver, etc., as the sensitizing component. In spite of the expense, however, the prior art has stood fast in its feeling that precious metals must be used if sensitization to electroless metal deposition and good bond strength between the sensitized surface and the electroless metal deposit is to be achieved. In one embodiment, such prior art noble metal sensitization baths are used sequentially by providing first a film of a Group IV metal ion, e.g., stannous ion, and then a film of reduced precious metal, e.g., reduced palladium, on the surface. In another embodiment, unitary noble metal baths are used, from which there is deposited on the surface a film of colloidal noble metal or a complex of noble metal which is later reduced.

In electroless metal deposition, good bond strengths between the insulating base and the electroless metal deposit is an essential requirement for many purposes. With some of the prior art noble metal sensitizers, e.g., the one part colloidal systems, the bond between the metal and the base material tends to be weak and, in extreme cases, non-existent. As a result, the deposited electroless metal layer of such structures tends to break free of the base, for example, when the base is subjected to differences in temperature, e.g., by soldering, or mechanical handling.

Some of the noble metal sensitizing systems have the further disadvantage that when metal clad stock is treated with the solution of precious metal, colloids tend to flash plate onto the metal cladding.

In attempting to remedy such shortcomings, the prior art has resorted to several techniques for insuring a good bond between the metal deposit and the insulating base. A typical solution has been to precoat the base with an adhesive or bonding coating prior to sensitization and electroless metal deposition. Such bonding or adhesive layers are subject to attack by solutions ordinarily encountered in printed circuit manufacture and thus tend to lose their effectiveness.

It has now been discovered that electroless metal deposits can be adherently applied to an insulating substrate without the need to use expensive noble metals so as to provide bond strengths which are at least as good and frequently better than those obtained using the expensive metals.

Following the teachings herein, metallized articles and printed circuits of outstanding quality can be obtained without using noble metals at any stage of their production.

DESCRIPTION OF THE INVENTION

According to the present invention there is provided a process for producing metallized articles by contacting a substrate with a solution comprising a reducible salt of a metal capable of catalyzing electroless metal deposition and a secondary reducing agent and thereafter contacting the so-treated substrate with a primary chemical reducing agent to reduce the metal salt to a layer of metallic nuclei, said nuclei being capable of catalyzing electroless metal deposition.

One preferred embodimemt of this invention is to include a complexing agent with the metal salt composition to stabilize the metal salt at a neutral or alkaline pH. In this embodiment, the increased rate benefits provided by the secondary reducer are particularly noticeable.

The present invention is based on a "double reducer" principle. The "secondary reducer" is in the reducible metal salt composition, but is not sufficient to provide reduced metallic metal nuclei alone. The "secondary" reducer cooperates with the "primary" reducer used later to provide the complete reduction of metallic nuclei in the second step. When a complexing agent is present, this combination of reducing agents provides unexpected and substantial improvements in the rate of reduction over that achieved with the primary reducing agent alone.

When used herein, a primary reducing agent is a chemical compound which will reduce a metal ion from a solution of the ion and a secondary reducing agent. A secondary reducing agent is a chemical compound that must be present in a solution of a reducible metal ion in order for the stronger primary reducing agent to reduce the metal ion to metallic nuclei.

In carrying out the present invention, the substrate is cleaned, if necessary, then exposed to the reducible metal salt composition, e.g., by dip-coating in a solution of the salt composition, on areas on which it is desired to deposit metal electrolessly. When it is desired to metallize only selected areas of the surface of a body and/or only selected interior portions thereof, e.g., hole walls, suitable masking may be used to protect the areas which are to be free of metal salt composition deposit during as well as after the exposure and subsequent reduction by the primary reducing agent.

Among the materials which may be used as substrates or bases in this invention are inorganic and organic substances, such as glass, ceramics, porcelain, mica, resins, paper, cloth, and the like. Metal-clad or unclad substances of the type described may be used.

Among the materials which may be used as the bases, may be mentioned metal clad or unclad insulating thermosetting resins, thermoplastic resins and mixtures of the foregoing, including fiber, e.g., fiber glass impregnated embodiments of the foregoing.

Included in the thermoplastic resins are acetal resins; acrylics, such as methyl acrylate, cellulosic resins, such as ethyl cellulose, cellulose acetate, cellulose propionate, cellulose acetate butyrate, cellulose nitrate, and the like; polyethers; nylon; polyethylene; polystyrene; styrene blends, such as acrylonitrile styrene copolymers and acrylonitrile-butadiene styrene copolymers; polycarbonates; polychlorotrifluoroethylene; and vinyl polymers and copolymers, such as vinyl acetate, vinyl alcohol, vinyl butyral vinyl chloride, vinyl chloride-acetate copolymer, vinylidene chloride and vinyl formal.

Among the thermosetting resins may be mentioned allyl phthalate; furane, melamine-formaldehyde, phenol formaldehyde and phenolfurfural copolymers, alone or compounded with butadiene acrylonitrile copolymers or acrylonitrile-butadiene-styrene copolymers; polyacrylic esters; silicones; urea formaldehydes; epoxy resins; allyl resins; glyceryl phthalates; polyesters; and the like.

Porous materials, comprising wood, Fiberglas, cloth and fibers, such as natural and synthetic fibers, e.g., cotton fibers, polyester fibers, and the like, as well as such materials themselves may also be metallized in accordance with the teachings herein.

The bases coated with catalytic metal nuclei generically will include any insulating material so-coated, regardless of shape or thickness, and includes thin films and strips as well as thick substrata.

The bases prepared by the processes of this invention are inorganic or organic materials of the type described which have surface layer comprising metallic nuclei which are catalytic to the reception of electroless metal, "catalytic" in this sense referring to an agent which is capable of reducing the metal ions in an electroless metal deposition solution to metal.

The catalytic metals for use herein are selected from metal ions, including multivalent ions, which in their fully reduced state catalyze the deposition of metals from electroless metal baths. Preferred ions will be selected from Period 4 of Groups VIII and IB of the Periodic Table of the Elements: iron, cobalt, nickel and copper. Particularly preferred is copper. These reducible ions can be in the form of ferrous, ferric, cobaltous, cobaltic, nickelous, nickelic, cuprous and cupric, and the metal ions may be used in admixture.

In this disclosure, it is to be understood that the terms "metal salt" and "metal salt composition" contemplate reducible metal salts and reducible metal salt compositions.

The metal salt composition for use in preparing the layer of metallic nuclei includes a cation of the reducible, catalytic metal and an associated anion — the nature of which is not critical — so long as it does not preclude the preparation of solutions. The anion may be organic or inorganic and typically it will be a halide, chloride, fluoride, bromide, iodide, or a sulfate, phosphate, carbonate, acetate, propionate, and the like.

As is mentioned above, the composition will optionally include a complexing agent for the reducible metal salt cation, and will be selected from a family of compounds well known to those skilled in the art. In general, the complexing agent will be an organic compound which will have at least one, and preferably two of an amine group, hydroxy group or carboxy group. Suitable complexing agents for the cations are Rochelle salts, the alkali metal and alkaline earth metal salts of aminoalkanoic acids, e.g., ethylenediaminetetraacetic acid, salts of nitrilotriacetic acid, gluconic acid and gluconates, alkanolamines, e.g., triethanolamine, glucono-Δ-lactone and the like. Especially preferred for copper is N,N,N',N'-tetrakis(2-hydroxypropyl)ethylenediamine. Other suitable complexing agents are disclosed in U.S. Pat. Nos. 2,938,805; 2,996,408; 3,075,855; and 3,075,856.

The metal salt composition includes as an essential ingredient a secondary reducing agent for the cation. Useful secondary reducing agents include formaldehyde and formaldehyde precursors or derivatives, such as paraformaldehyde, trioxane, dimethylhydantoin or glyoxal and the like. Especially preferred reducing agents are formaldehyde, paraformaldehyde or glyoxal.

The metal salt compositions are best applied from a solution in a solvent which can comprise, e.g., water or an organic compound. The nature of the solvent is not particularly critical so long as it is not reactive with the components in the composition and does not attack the substrate. Preferably, the solvent will be volatile enough to remove by evaporation in conventional equipment. Suitable solvents will be, for example, in addition to water, dimethyl formamide, methanol, n-butanol, 1,1,1-trichloroethylene, ethyl acetate, acetone and the like.

The ratio of reactants in the metal salt composition is not critical so long as there is at least sufficient complexing agent to complex all of the metal cations and enough reducing agent to reduce all or substantially all of the cation completely to the metallic state. For this reason, it is preferred to include an excess of both complexing agent and reducing agent, e.g., from 1.1 to about 10 equivalents of each per equivalent of the cation. This insures complete reduction. The amount of metal salt can comprise, e.g., from 0.1 to about 50 parts by weight per 100 parts by volume of solvent.

In more detail, in accordance with the present process, the base, if necessary, will be cleaned and treated by methods to be described later. The base is then dip-coated into one of the metal salt solutions for a short time, e.g., 1–5 minutes and removed. The layer can be moist or dry. The drying rate is not critical but is dependent on the method of drying, the solvent used and the temperature. Elevated temperatures are not preferred, however, because some secondary reducers volatilize. In non-aqueous systems, the drying rate is mainly regulated by the type of solvent system used. For example 1,1,1-trichloroethane and ethyl acetate dry rapidly in air and thus require little or no heat.

The base having a moist or dry layer of the metal salt composition thereon is next immersed into a primary chemical reducing solution until reduction is complete.

Suitable primary chemical reducing solutions comprise aqueous or non-aqueous solutions of borohydrides, e.g., alkali metal or alkaline earth metal borohydrides or ammonium and substituted ammonium borohydrides, amine boranes, e.g., dialkyl amine boranes, e.g., dimethyl, diethyl, diisopropyl amine borane, morpholino borane, substituted borohydrides, e.g., alkali metal trialkoxyborohydrides, e.g., sodium trimethoxyborohydride, and the like. The solvents for such solutions will be substantially inert to the reducing agent and not attack the substrate and may include, in addition to water, dimethyl formamide, methanol, n-butanol and the like. The amount of reducing agent can comprise, e.g., from 0.5 to about 100 parts by weight per 1000 parts by volume of solvent.

It has been found that the rate of reduction to metal nuclei can be increased if the reducible metal salt composition also includes a small amount of a metallic accelerator. Such compounds include, for example, tin compounds, e.g., stannous chloride, silver compounds, palladium compounds, e.g., palladium chloride, gold compounds, mercury compounds, cobaltous chloride, nickelous chloride, zinc chloride, and the like. Addition of from about 1 mg./liter to about 2 g./liter of such metallic accelerators has a beneficial effect. There will be no advantage in using more than about 25 mg. per liter of palladium compound because the maximum rate increase is attained below this amount, and to use more is wasteful.

After treatment with the primary reducing agent, the base is then rinsed with water or another suitable solvent for about 3–5 minutes. Finally, the base is immersed into an electroless metal bath for the deposition of metal and, if desired, an electroplated metal deposit is finally put down as a top layer.

Typically, the autocatalytic or electroless metal deposition solutions for use in depositing electroless metal on the bodies having a layer of catalytic metal nuclei prepared as described herein comprise an aqueous solution of a water soluble salt of the metal or metals to be deposited, a reducing agent for the metal cations, and a complexing or sequestering agent for the metal cations. The function of the complexing or sequestering agent is to form a water soluble complex with the dissolved metallic cations so as to maintain the metal in solution. The function of the reducing agent is to reduce the metal cation to metal at the appropriate time.

Typical of such solutions are electroless copper, nickel, cobalt, silver, gold, tin, rhodium and zinc solutions. Such solutions are well known in the art and are capable of autocatalytically depositing the identified metals without the use of electricity.

Typical of the electroless copper solutions which may be used are those described in U.S. Pat. No. 3,095,309, the description of which is incorporated herein by reference. Conventionally, such solutions comprise a source of cupric ions, e.g., copper sulfate, a reducing agent for cupric ions, e.g., formaldehyde, a complexing agent for cupirc ions, e.g., tetrasodium ethylenediaminetetraacetic acid, and a pH adjustor, e.g. sodium hydroxide.

Typical electroless nickel baths which may be used are described in Brenner, *Metal Finishing*, November 1954, pages 68 to 76, incorporated herein by reference. They comprise aqueous solutions of a nickel salt, such as nickel chloride, an active chemical reducing agent for the nickel salt, such as the hypophosphite ion, and a complexing agent, such as carboxylic acids and salts thereof.

Electroless gold plating baths which may be used are disclosed in U.S. Pat. No. 2,976,181, incorporated herein by reference. They contain a slightly water soluble gold salt, such as gold cyanide, a reducing agent for the gold salt, such as the hypophosphite ion, and a chelating or complexing agent, such as sodium or potassium cyanide. The hypophosphite ion may be introduced in the form of the acid or salts thereof, such as the sodium calcium and the ammonium salts. The purpose of the complexing agent is to maintain a relatively small portion of the gold in solution as a water soluble gold complex, permitting a relatively large portion of the gold to remain out of solution as gold reserve. The pH of the bath will be about 13.5 or between about 13 and 14, and the ion ratio of hypophosphite radical to insoluble gold salt may be between about 0.33 and 10:1.

Typical electroless cobalt and electroless silver baths will be described in the Examples. Electroless tin, rhodium and zinc baths are known to those skilled in the art.

A specific electroless copper deposition bath suitable for use is as follows:

|  | Moles/liter |
|---|---|
| Copper sulfate | 0.03 |
| Sodium hydroxide | 0.125 |
| Sodium cyanide | 0.0004 |
| Formaldehyde | 0.08 |
| Tetrasodium ethylenediaminetetraacetate | 0.036 |
| Water | Remainder |

This bath is preferably operated at a temperature of about 55°C. and will deposit a coating of ductile electroless copper about 1 mil thick in about 51 hours.

Utilizing the electroless metal baths of the type described, very thin conducting metal films or layers will be laid down on the catalytic metal nuclei. Ordinarily, the metal films superimposed on the non-conductive layer catalytic metal nuclei by electroless metal deposition will range from 0.1 to 7 mils in thickness, with metal films having a thickness of even less than 0.1 mil being a distinct possibility.

Among its embodiments, the present invention contemplates metallized substrates in which the electroless metal, e.g., copper, nickel, gold or the like, has been further built up by attaching an electrode to the electroless metal surface and electrolytically, i.e., galvanically depositing on it more of the same or different metal, e.g., copper, nickel, silver, gold, rhodium, tin, alloys thereof, and the like. Electroplating procedures are conventional and well known to those skilled in the art.

For example, a pyrophosphate copper bath is commercially available for operation at a pH of 8.1 to 8.4, a temperature of 50°C., and a current density of 50 amp/sq.ft. In addition, a suitable fluoborate copper bath is operated at a pH of 0.6 to 1.2, a temperature of 25°–50°C., and a current density of 25 to 75 amp. per sq. ft. and is comprised of:

| copper fluoborate $Cu(BF_4)_2$ | 225 – 450 g./l. |
| fluoboric acid, $HBF_4$ | 2 – 15 g./l. |
| boric acid, $H_3BO_3$ | 12 – 15 g./l. |

Silver may be deposited electrolytically from a cyanide bath operated at a pH of 11.5 to 12, a temperature of 25°–35°C., and a current density of 5–15 amp./sq.ft. An illustrative electrolytic silver bath is comprised of:

| | |
|---|---|
| silver cyanide, AgCN | 50 g./l. |
| potassium cyanide, KCN | 110 g./l. |
| potassium carbonate, K$_2$CO$_3$ | 45 g./l. |
| brighteners | Variable |

Gold may be deposited electrolytically from an acid gold citrate bath at pH 5–7, a temperature of 45°–60°C., and a current density of 5–15 amp./sq.ft. An illustrative electrolytic gold bath consists of:

| | |
|---|---|
| sodium gold cyanide, NaAu(CN)$_2$ | 20 – 30 g./l. |
| dibasic ammonium citrate (NH$_4$)$_2$C$_6$H$_5$O$_7$ | 25 – 100 g./l. |

Nickel can be electrolytically deposited at pH 4.5 to 5.5, a temperature of 45°C., and a current density of 20–65 amp./sq.ft., the bath containing:

| | |
|---|---|
| nickel sulfate, NiSO$_4$.6H$_2$O | 240 g./l. |
| nickel chloride, NiCl$_2$.6H$_2$O | 45 g./l. |
| boric acid, H$_3$BO$_3$ | 30 g./l. |

Tin and rhodium and alloys can be electrolytically deposited by procedures described in Schlabach et al., Printed and Integrated Circuitry, McGraw-Hill, New York, 1963, p. 146–148.

It is essential in carrying out the process of this invention to use a clean base — otherwise adhesion, as measured by the work needed to peel the electroless metal from the base, will be non-existent. Ordinarily, this will require chemical cleaning and/or polarization the surface of the base. With absorbent substrates, e.g., glass cloth, fabrics, paper and the like, no special pretreatment is required, but the surface must be clean.

If the base is metal clad laminate, e.g., having holes drilled through or punched therein, conventional cleaning methods are used to remove all contaminants and loose particles. The surface should be "chemically clean", i.e., free of grease, and surface films. A simple test is to spray the surface with distilled water. If the surface is chemically clean, the water will form a smooth film. If not, the water will break into droplets.

A base can be made clean by scrubbing with pumice or the like to remove heavy soils; rinsing with water, and subsequently removing soiling due to organic substances with a suitable alkaline cleaning composition, e.g.:

| | |
|---|---|
| sodium isopropyl naphthalene sulfonate | 3 g./l. |
| sodium sulfate | 1 g./l. |
| sodium tripolyphosphate | 14 g./l. |
| sodium metasilicate | 5 g./l. |
| tetrasodium pyrophosphate | 27 g./l. |

This operation is desirably performed at 160°–180°F. The surfaces are exposed to the bath for 5 to 30 minutes. Other suitable alkali cleaning compositions, detergents and soaps may be used, taking care in the selection not to have the surface attacked by the cleaner. If present, surface oxides can be removed from metal surfaces with light etchants, such as 25% ammonium persulfate in water, or the cupric chloride etchant of U.S. Pat. No. 2,908,557. On the other hand, if the shape of the base permits, a sanding operation with fine abrasive can also be used to remove oxides.

Unclad resinous substrates, e.g., epoxy resin, impregnated fibrous structures and varnish, e.g., epoxy resin varnish, coated resin impregnated fiber structures are best provided with an additional surface treatment, e.g., the direct bonding pretreatment process of copending U.S. Ser. No. 72,582, filed Sept. 16, 1970, incorporated by reference, to achieve strong adhesion of electroless metal deposits to the base.

This generally comprises treating the base with a suitable organic or inorganic acid, e.g., chromic or sulfuric acid, or base solution to render it porous. In many cases it is desirable to treat the surface with an agent, e.g., dimethyl formamide or dimethyl sulfoxide, before or during the etching process. By such a technique the surface is polarized.

Depending upon the particular insulating bases involved, other ion exchange imparting materials may be utilized to effect the aforementioned etching and resulting ion exchange imparting chemical reaction. For example, acidified sodium fluoride, hydrochloric and hydrofluoric acids, chromic acid, borates, fluoroborates and caustic soda, as well as mixtures thereof, have been found effective to etch and therefore chemically react with various of the synthetic plastic resin insulating materials described herein.

In a typical procedure, after treatment with the aforesaid agents, the insulating bodies are rinsed so as to eliminate any residual agent, following which they are immersed in a solution containing a wetting agent, the ions of which are base exchanged with the surface of the insulating base to thereby impart to the base relatively long chained ions which also are capable of chemically linking with precious metal ions or ionic complexes containing precious metal ions. Following treatment with the wetting agent, the insulating bodies are rinsed again so as to eliminate the residual wetting agent solution.

DESCRIPTION OF THE PREFERRED EMBODIMENTS

The following examples illustrate the methods and articles of this invention. They are not to be construed to limit the invention in any manner whatsoever.

EXAMPLE 1

A copper clad epoxy-glass laminate having holes drilled in it for through hole connections is cleaned with a hot alkaline cleaner of the type described above, and all loose particles are removed.

The clean laminate is dip coated for 1–2 minutes in a solution of the following formulation:

| | |
|---|---|
| cupric sulfate | 25 g. |
| N,N,N′,N′-tetrakis(2-hydroxypropyl)ethylenediamine | 40 g. |
| formaldehyde (37%) | 50 ml. |
| water (to make) | 1000 ml. |

The pH of the resultant solution is 6.9.

The coated substrate is allowed to become dry by air-evaporation of the solvents.

The substrate, coated with the copper salt composition, is immersed for 1–2 minutes into a reducing solution of the following composition:

| | |
|---|---|
| sodium borohydride | 5 g. |
| water (to make) | 1000 ml. |

The substrate, the surface of which has substantially darkened in color due to the deposition of a layer of metallic copper nuclei, is rinsed in running water for 3–5 minutes.

An electroless copper layer is deposited on the layer of copper nuclei on the catalytic substrate by immersing it in a bath at 55°C., the bath having the following composition:

| | |
|---|---|
| cupric sulfate | 0.03 moles/l. |
| sodium hydroxide | 0.125 moles/l. |
| sodium cyanide | 0.0004 moles/l. |
| formaldehyde | 0.08 moles/l. |
| tetrasodium ethylenediamine tetraacetate | 0.036 moles/l. |
| water | Remainder |

The surface of the base and the walls of the holes in the base are covered with a firmly adherent layer of bright, ductile electrolessly deposited copper.

EXAMPLE 2

The procedure of Example 1 is repeated, substituting for the copper clad laminate base, an unclad epoxy impregnated glass fiber laminate (Westinghouse M-6528). The base is polarized as follows:

a. Treat the surface of the base by dipping in dimethyl formamide (DMF, sp.gr. 0.947–0.960 at 24°C.) for 5 minutes, and drain for 15 seconds.

b. Solvent rinse the base in 9 parts by volume, of ethyl acetate and 1 part by volume DMF (sp.gr. 0.900–0.922 at 24°C.) with occasional rack agitation to clear the holes for 30 seconds, and then drain for 15 seconds.

c. Repeat step (b) in a second solvent rinse tank, drain 15 seconds, then allow parts on rack load to air dry for 2 minutes.

d. Treat the base in a bath comprising:

| | |
|---|---|
| $CrO_3$ | 80–100 g./l. |
| Conc. $H_2SO_4$ | 200–250 ml./l. |
| Fluorocarbon wetting agent (3-M Company, Fc-95) | 0.5 g./l. | at 40°–45°C. with gentle agitation of the solution for 5 minutes and drain for 15 seconds.

e. Neutralize the base with potassium bisulfite solution for 1–2 minutes.

f. Rinse the polarized base for 5 minutes.

The polarized base is sensitized and an electroless copper layer is deposited thereon by the procedure of Example 1.

EXAMPLE 3

A clean epoxy-glass laminate polarized according to the procedure of Example 2 is dip-coated for 1–5 minutes into a metal salt solution of the following formulation:

| | |
|---|---|
| Cupric nitrate | 2.5 g. |
| N,N,N',N'-tetrakis(2-hydroxypropyl)ethylenediamine | 5 g. |
| formaldehyde (37%) | 50 ml. |
| methanol (to make) | 1000 ml. |

The pH of the resultant solution is 6.7.
The substrate is allowed to become dry.
The metallic compound coated substrate is immersed for 1–2 minutes into a reducing solution of the formulation:

| | |
|---|---|
| tetramethylammonium borohydride | 5 g. |
| water (to make) | 1000 ml. |

The substrate, the surface of which has substantially darkened in color due to the deposition of a layer of metallic copper nuclei, is rinsed in running water for 3–5 minutes.

The sensitized substrate is then coated with a layer of electroless copper by immersing it into an electroless plating bath as described in Example 1.

EXAMPLES 4 – 14

The procedure of Example 3 is repeated, substituting for the cupric nitrate salt solution, the following: Example 4

| | |
|---|---|
| N,N,N',N'-tetrakis(2-hydroxypropyl)ethylenediamine | 40 g. |
| cupric sulfate | 25 g. |
| formaldehyde (37%) | 50 ml. |
| dimethyl formamide (to make) | 1000 ml. |

The pH of the resultant solution is 9.5.

EXAMPLE 5

| | |
|---|---|
| N,N,N',N'-tetrakis(2-hydroxypropyl)ethylene diamine | 40 g. |
| cupric sulfate | 25 g. |
| formaldehyde (37%) | 50 ml. |
| 1-butanol (to make) | 1000 ml. |

The pH of the resultant solution is 9.25.

EXAMPLE 6

| | |
|---|---|
| sodium citrate | 50 g. |
| nickelous chloride | 30 g. |
| formaldehyde | 50 ml. |
| water (to make) | 1000 ml. |

The pH of the resultant solution is 6.15.

EXAMPLE 7

| | |
|---|---|
| Rochelle salt | 11 g. |
| cobaltous acetate | .5 g. |
| formaldehyde | 50 ml. |
| water (to make) | 1000 ml. |

The pH of the resultant solution is 6.3.

EXAMPLE 8

| | |
|---|---|
| ethylenediamine tetraacetic acid | 14 g. |
| cupric sulfate | 5 g. |
| glyoxal (30% in water) | 20 ml. |
| water (to make) | 1000 ml. |

The pH of the resultant solution is 5.45.

EXAMPLE 9

| | |
|---|---|
| ferrous sulfate | 30 g. |
| formaldehyde (37%) | 50 ml. |
| methanol | 1000 ml. |

The pH of the resultant solution is 4.75.

EXAMPLE 10

| | |
|---|---|
| nickel sulfate | 30 g. |
| formaldehyde (37%) | 50 ml. |
| methanol (to make) | 1000 ml. |

The pH of the resultant solution is 5.65.

EXAMPLE 11

| | |
|---|---|
| cupric sulfate | 5 g. |
| palladium chloride | 10 mg. |
| Rochelle salt | 10 g. |
| paraformaldehyde | 20 g. |
| water (to make) | 1000 ml. |

The pH of the resultant solution is 4.45.

EXAMAPLE 12

| | |
|---|---|
| cupric sulfate | 5 g. |
| cobaltous acetate | 1 g. |
| Rochelle salt | 10 g. |
| formaldehyde (37%) | 50 ml. |
| water (to make) | 1000 ml. |

The pH of the resultant solution is 4.8.

EXAMPLE 13

| | |
|---|---|
| cupric sulfate | 5 g. |
| N,N,N',N'-tetrakis(2-hydroxy-propyl)ethylene diamine | 8 g. |
| silver nitrate | 10 mg. |
| formaldehyde (37%) | 50 ml. |
| water (to make) | 1000 ml. |

The pH of the resultant solution is 6.5.

EXAMPLE 14

| | |
|---|---|
| cupric acetate | 2 g. |
| formaldehyde (37%) | 20 ml. |
| water (to make) | 1000 ml. |

The pH of the resultant solution is 6.0.

The metal salts on the dry, coated substrates are reduced to metallic nuclei with the sodium borohydride solution and an electroless copper layer is deposited thereon by the procedure of Example 1. It is to be noted that, in addition to copper metal nuclei, there are employed nickel (Example 6), cobalt (Example 7) and iron (Example 9) nuclei, as well as mixed metal nuclei (Example 12) and compositions containing metallic accelerators (Examples 11 and 13). EXAMPLES 15 – 17

The procedure of Example 3 is repeated, substituting the following reducing solutions for sodium borohydride in water:

EXAMPLE 15

| | |
|---|---|
| sodium borohydride | 7.5 g. |
| water (to make) | 1000 ml. |
| sodium hydroxide (to pH 13) | |

EXAMPLE 16

| | |
|---|---|
| sodium borohydride | 10 g. |
| dimethyl formamide | 1000 ml. |

EXAMPLE 17

| | |
|---|---|
| dimethylamine borane | 20 g. |
| sodium hydroxide | 38 g. |
| water (to make) | 1000 ml. |

In all cases copper metallized substrates according to this invention are obtained.

EXAMPLE 18 – 21

The procedure of Examples 1 and 3 are repeated, substituting for the electroless copper solution, an electroless nickel solution:

EXAMPLE 18

| | |
|---|---|
| nickel chloride | 30 g. |
| sodium hypophosphite | 10 g. |
| glycollic acid | 25 g. |
| sodium hydroxide | 12.5 g. |
| water (to make) | 1000 ml. |

The pH is adjusted to 4.5 and the bath temperature is maintained at 95°C. A nickel layer is built up on the copper nuclei.

The procedure of Examples 1 and 3 are repeated, substituting for the electroless copper solution, an electroless cobalt solution:

EXAMPLE 19

| | |
|---|---|
| cobalt chloride | 30 g. |
| sodium hypophosphite | 20 g. |
| sodium citrate dihydrate | 29 g. |
| ammonium chloride | 50 g. |
| water (to make) | 1000 ml. |

The pH is adjusted to 9.5 and the bath temperature is maintained at 90°C. A cobalt layer is built up on the copper nuclei.

The procedure of Examples 1 and 3 are repeated, substituting for the electroless copper solution, an electroless gold solution:

EXAMPLE 20

| | |
|---|---|
| gold chloride hydrochloride trihydrate | 0.01 mole/l. |
| sodium potassium tartrate | 0.014 mole/l. |
| dimethylamine borane | 0.013 mole/l. |
| sodium cyanide | 0.4 g./l. |
| water | q.s.a.d. |

The pH is adjusted to 13 and the bath temperature is maintained at 60°C. A gold layer is built up on the copper nuclei.

The procedure of Examples 1 and 3 are repeated, substituting for the electroless copper solution, an electroless silver solution:

EXAMPLE 21

| | |
|---|---|
| silver nitrate | 1.7 g. |
| sodium potassium tartrate | 4 g. |
| sodium cyanide | 1.8 g. |
| dimethylamine borane | 0.8 g. |
| water (to make) | 1000 ml. |

The pH is adjusted to 13 and the bath temperature is maintained at 80°C. A silver layer is built up on the copper nuclei.

The non-conductive layers of nickel, cobalt and iron nuclei prepared as described above can also be built up as described for the copper nuclei in these examples with electroless nickel, cobalt, gold, silver, tin, rhodium and zinc.

All such metallized substrates having a layer of electroless metal on top of the nuclei, can further be built up with an electroplated layer of copper, silver, gold, nickel, cobalt, tin, rhodium and alloys thereof, using the baths and conditions described hereinabove.

The above disclosure demonstrates that the present process provides for the reduction of a layer of reducible metal salt to a layer of metallic nuclei by means of chemical reduction. The layer of nuclei has been shown to be catalytic to adherent electroless metal deposition and this metal can be further built up in thickness with electroplated metal.

The above teachings disclose means to use the instant invention in the preparation of metallized articles. Other methods will readily suggest themselves to those skilled in the art.

For example, the sensitized substrates may be suitably masked in areas to leave circuit patterns uncovered and merely by building up a conductive layer of electroless metal on the exposed nuclei a printed circuit board will be formed.

On the other hand, a thin electroless deposit of metal can be built up on the nuclei, sufficient in thickness to serve as a common cathode and, after applying a negative mask and building up the conductive pattern by electroplating, the negative mask can be removed and the background electroless metal removed by a quick etch.

Designs can be put on substrates by printing selected areas, e.g., by block printing, by using textile rollers or by free hand printing with the metallic compositions containing secondary reducers, then treating with the primary reducer to form metallic nuclei in selected areas which can be built up with electroless deposits of metal.

Substrates can include epoxy glass laminates, polyester film, ceramics, paper, mica, asbestos and the like. The direct bonding treatment described above provides a very active surface to which the metal salt strongly adsorbs and ultimately there is formed a strong bond between the base and the electrolessly deposited metal.

The invention in its broader aspects is not limited by the specific steps, methods, compositions and improvements shown and described herein, and departures may be made within the scope of the accompanying claims without departing from the principles thereof.

I claim:

1. A process for the production of an article catalytic to the electroless deposition of metal comprising the steps of:
   a. treating a substrate with a liquid comprising the admixture of a reducible salt of a non-noble metal capable of catalyzing electroless metal deposition and at least one secondary reducing agent selected from the group consisting of formaldehyde and its precursors or derivatives; and
   b. contacting the treated substrate of step (a) with a primary reducing agent comprising at least one member of the group consisting of borohydrides and borones, thereby rendering said substrate catalytic to the deposition of metal from an electroless metal deposition bath.

2. A process according to claim 1, wherein said secondary reducing agent is selected from the group consisting of formaldehyde, paraformaldehyde, trioxane, dimethylhydantoin and glyoxal.

3. A process according to claim 2, wherein said secondary reducing agent is selected from the group consisting of formaldehyde, paraformaldehyde and glyoxal.

4. A process according to claim 1, wherein said liquid has a pH of from about 4.4 to about 9.5

5. A process for the production of a metallized article including the steps of claim 1 and the subsequent step of exposing said substrate to an electroless metal deposition bath to form a layer of electroless metal thereon.

6. A process according to claim 1, wherein said liquid also comprises the admixture of a complexing agent for said reducible salt.

7. A process according to claim 1, wherein said liquid also comprises the admixture of a metallic accelerator.

8. A process according to claim 1 wherein said primary reducing agent comprises at least one member of the group consisting of: the borohydride and substituted borohydride of an alkali metal, alkaline earth metal, ammonium, and substituted ammonium; and the amine boranes.

9. A process according to claim 8 wherein said primary reducing agent comprises at least one member of the group consisting of sodium borohydride, tetramethylammonium borohydride and dimethylamine borane.

10. A process for the production of an article catalytic to the electroless deposition of metal comprising the steps of:
   a. treating a substrate with a liquid comprising the admixture of:
      1. a reducible salt of at least one metal selected from the group consisting of copper, nickel, cobalt and iron; and
      2. at least one secondary reducing agent selected from the group consisting of formaldehyde and its precursors or derivatives; and
   b. contacting the treated substrate of step (a) with a primary reducing agent comprising at least one member of the group consisting of borohydrides and boranes thereby rendering said substrate catalytic to the deposition of metal from an electroless metal deposition bath.

11. A process according to claim 10, wherein said secondary reducing agent is selected from the group consisting of formaldehyde, paraformaldehyde, trioxane, dimethylhydantoin and glyoxal.

12. A process according to claim 11, wherein said secondary reducing agent is selected from the group consisting of formaldehyde, paraformaldehyde and glyoxal.

13. A process according to claim 10, wherein said liquid has a pH of from about 4.4 to about 9.5.

14. A process for the production of a metallized article including the steps of claim 10 and the subsequent step of exposing said substrate to an electroless metal deposition bath to form a layer of electroless metal thereon.

15. A process according to claim 10, wherein said liquid also comprises the admixture of a complexing agent for said reducible salt.

16. A process according to claim 10, wherein said liquid also comprises the admixture of a metallic accelerator.

17. A process according to claim 10 wherein said primary reducing agent comprises at least one member of the group consisting of: the borohydride and substituted borohydride of an alkali metal, alkaline earth metal, ammonium, and substituted ammonium; and the amine boranes.

18. A process according to claim 17 wherein said primary reducing agent comprises at least one member of the group consisting of sodium borohydride, tetramethylammonium borohydride and dimethylamine borane.

19. A process for the production of an article catalytic to the electroless deposition of metal comprising the steps of:
   a. treating a substrate with a liquid comprising the admixture of:
      1. a reducible salt of at least one metal selected from the group consisting of copper, nickel, cobalt and iron; and
      2. at least one secondary reducing agent selected from the group consisting of formaldehyde, paraformaldehyde, trioxane, dimethylhydantoin and glyoxal; and
   b. contacting the treated substrate of step (a) with a primary reducing agent comprising at least one member of the group consisting of borohydrides and boranes thereby rendering said substrate catalytic to the deposition of metal from an electroless metal deposition bath.

20. A process according to claim 19, wherein said secondary reducing agent is selected from the group consisting of formaldehyde, paraformaldehyde and glyoxal.

21. A process according to claim 19, wherein said liquid has a pH of from about 4.4 to about 9.5.

22. A process for the production of a metallized article including the steps of claim 19 and the subsequent step of exposing said substrate to an electroless metal deposition bath to form a layer of electroless metal thereon.

23. A process according to claim 19, wherein said liquid also comprises the admixture of a complexing agent for said reducible salt.

24. A process according to claim 19, wherein said liquid also comprises the admixture of a metallic accelerator.

25. A process according to claim 19 wherein said primary reducing agent comprises at least one member of the group consisting of: the borohydride and substituted borohydride of an alkali metal, alkaline earth metal, ammonium, and substituted ammonium; and the amine boranes.

26. A process according to claim 25 wherein said primary reducing agent comprises at least one member of the group consisting of sodium borohydride, tetramethylammonium borohydride and dimethylamine borane.

27. A process for the production of an article catalytic to the electroless deposition of metal comprising the steps of:
   a. treating a substrate with a liquid comprising the admixture of:
      1. a reducible salt of at least one metal selected from the group consisting of copper, nickel, cobalt and iron; and
      2. at least one secondary reducing agent selected from the group consisting of formaldehyde, paraformaldehyde and glyoxal, wherein said liquid has a pH of from about 4.4 to about 9.5; and
   b. contacting the treated substrate of step (a) with a primary reducing agent comprising at least one member of the group consisting of borohydrides and boranes, thereby rendering said substrate catalytic to the deposition of metal from an electroless metal deposition bath.

28. A process according to claim 27, wherein said reducible salt is copper salt.

29. A process for the production of a metallized article including the steps of claim 27 and the subsequent step of exposing said substrate to an electroless metal deposition bath to form a layer of electroless metal thereon.

30. A process according to claim 27, wherein said liquid also comprises the admixture of a complexing agent for said reducible salt.

31. A process according to claim 27, wherein said liquid also comprises the admixture of a metallic accelerator.

32. A process according to claim 27 wherein said primary reucing agent comprises at least one member of the group consisting of: the borohydride and substituted borohydride of an alkali metal, alkaline earth metal, ammonium, and substituted ammonium; and the amine boranes.

33. A process according to claim 32 wherein said primary reducing agent comprises at least one member of the group consisting of sodium borohydride, tetramethylammonium borohydride and dimethylamine borane.

34. A process for the production of an article catalytic to the electroless deposition of metal comprising the steps of:
   a. treating a substrate with a liquid comprising the admixture of:
      1. a reducible copper salt;
      2. a complexing agent for copper; and
      3. at least one secondary reducing agent selected from the group consisting of formaldehyde, paraformaldehyde and glyoxal, wherein said liquid has a pH of from about 4.4 to about 9.5; and
   b. contacting the treated substrate of step (a) with a primary reducing agent comprising at least one member of the group consisting of borohydrides and boranes thereby rendering said substrate catalytic to the deposition of metal from an electroless metal deposition bath.

35. A process according to claim 24, wherein said liquid also comprises the admixture of a metallic accelerator.

36. A process according to claim 34 wherein said primary reducing agent comprises at least one member of the group consisting of: the borohydride and substituted borohydride of an alkali metal, alkaline earth metal, ammonium, and substituted ammonium; and the amine boranes.

37. A process according to claim 36 wherein said primary reducing agent comprises at least one member of the group consisting of sodium borohydride, tetramethylammonium borohydride and dimethylamine borane.

* * * * *